United States Patent
Chang et al.

(10) Patent No.: US 9,960,085 B2
(45) Date of Patent: May 1, 2018

(54) MULTIPLE PATTERNING TECHNIQUES FOR METAL GATE

(71) Applicant: Taiwan Semiconductor Manufacturing Co., Ltd., Hsin-Chu (TW)

(72) Inventors: Hsiang-Pi Chang, New Taipei (TW); Chih-Hao Wang, Baoshan Township (TW); Wei-Hao Wu, Hsinchu (TW); Hung-Chang Sun, Kaohsiung (TW); Lung-Kun Chu, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 2 days.

(21) Appl. No.: 15/001,364

(22) Filed: Jan. 20, 2016

(65) Prior Publication Data
US 2017/0207133 A1    Jul. 20, 2017

(51) Int. Cl.
*H01L 21/338* (2006.01)
*H01L 21/8238* (2006.01)
*H01L 27/092* (2006.01)
*H01L 29/49* (2006.01)

(52) U.S. Cl.
CPC .... *H01L 21/823842* (2013.01); *H01L 27/092* (2013.01); *H01L 29/4966* (2013.01)

(58) Field of Classification Search
CPC ........... H01L 21/823842; H01L 27/092; H01L 29/4966; H01L 21/8238; H01L 21/8228; H01L 27/0826; H01L 29/66545
See application file for complete search history.

(56) References Cited

U.S. PATENT DOCUMENTS

| 8,349,680 B2 | 1/2013 | Thei et al. |
| 8,507,992 B2 | 8/2013 | Mo et al. |
| 2013/0075827 A1* | 3/2013 | Lee ...................... H01L 29/4966 257/369 |
| 2015/0014782 A1* | 1/2015 | Kwon ............. H01L 21/823807 257/369 |

OTHER PUBLICATIONS

Huang, et al. "Impact of the TiN Barrier Layer on the Positive Bias Temperature Instabilities of High-k/Metal-Gate Field Effect Transistors." Japanese Journal of Applied Physics 54. Jan. 19, 2015.

* cited by examiner

*Primary Examiner* — Julio J Maldonado
*Assistant Examiner* — Stanetta Isaac
(74) *Attorney, Agent, or Firm* — Eschweiler & Potashnik, LLC (57) ABSTRACT

The present disclosure relates to an integrated circuit with a work function metal layer disposed directly on a high-k dielectric layer, and an associated method of formation. In some embodiments, the integrated circuit is formed by forming a first work function metal layer directly on a high-k dielectric layer. Then the first work function metal layer is patterned to be left within a first gate region of a first device region and to be removed within a second gate region of a second device region. Thereby, the first work function metal layer is patterned directly on the high-k dielectric layer, using the high-k dielectric layer as an etch stop layer, and the patterning window is improved.

20 Claims, 6 Drawing Sheets

Fig. 10

MULTIPLE PATTERNING TECHNIQUES FOR METAL GATE

BACKGROUND

A CMOS transistor device is formed with a gate dielectric and a gate electrode, to control current flows through a channel under the gate dielectric between a pair of source/drain regions. As scaling down tendency continues, the gate dielectric begins to break down causing the gate dielectric to lose its insulating (dielectric) quality and to exhibit a larger leakage. There has been a desire to replace the gate oxide and the polysilicon gate with a high-k gate dielectric and metal gate electrode, in favor of improving device performance such as leakage and channel mobility. The high-k dielectric and metal gate electrode use metal gate stacks with the right work functions on the high-k dielectric for high-performance CMOS logic applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High-k dielectric and metal gate (HK/MG) processes are widely utilized in modern transistor device manufacturing processes. High-k dielectric and metal gate processes typically use a multiple patterning process, in which gate electrodes of the transistors are formed by patterning multiple metal layers, as known as work function metals, over the high-k dielectric layer to build different metal gate stacks having different work functions. In order to protect the high-k dielectric layer from damage during the patterning processes, a barrier layer, made of a metal nitride for example, is traditionally formed between a bottom work function metal layer and the high-k dielectric layer. The barrier layer is usually highly selective to an etchant used to pattern the work function metals and therefore functions as an etch stop layer for work function metals' patterning.

However, it has been appreciated that the existence of the barrier layer limits the patterning window of the work function metals (e.g., the barrier layer limits an ability to control the tolerances by which the work function metals can be etched). The limited patterning window makes it challenging to control threshold values of the transistors for the high-k dielectric and metal gate processes, therefore leading to device performance issues.

The present disclosure relates to an integrated circuit with a work function metal layer disposed directly on a high-k dielectric layer, and an associated method of formation. By forming the work function metal layer directly onto the high-k dielectric layer, the patterning window of the work function metal layer is improved. In some embodiments, the integrated circuit is formed by forming a high-k dielectric layer over a substrate comprising a first device region and a second device region. A first work function metal layer is directly formed on the high-k dielectric layer. Then the first work function metal layer is patterned to be left within a first gate region of the first device region and to be removed within a second gate region of the second device region. Thereby, the first work function metal layer is patterned directly on the high-k dielectric layer, using the high-k dielectric layer as an etch stop layer, and the patterning window is improved. In some embodiments, additional work function metal layers can be formed and patterned after patterning the first work function metal layer to achieve desired work functions on the high-k dielectric layer.

Figure 1A:
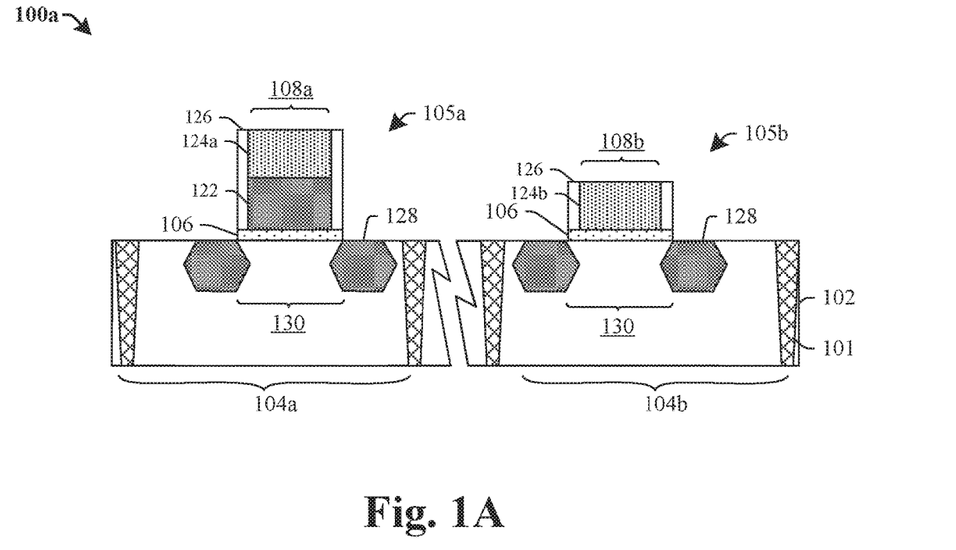
FIG. 1A illustrates a cross-sectional view of some embodiments of an integrated circuit with a work function metal layer disposed directly on a high-k dielectric layer.

FIG. 1a illustrates a cross-sectional view of some embodiments of an integrated circuit 100a with a work function metal layer disposed directly on a high-k dielectric layer.

As shown in FIG. 1a, the integrated circuit 100a comprises a substrate 102 having a first device region 104a and a second device region 104b. In some embodiments, first device region 104a and the second device region 104b may be separated by one or more isolation regions 101 arranged within the substrate 102. The first device region 104a and the second device region 104b respectively comprise transistors 105a-105b having source/drain regions 128 separated by channel regions 130. Gate structures 108a-108b are disposed directly above the channel regions 130. The gate structures 108a-108b are vertically separated from the channel regions 130 by a high-k dielectric layer 106.

The first device region 104a and the second device region 104b have different gate structures. For example, a first gate structure 108a within the first device region 104a can comprise a first metal gate layer 122 disposed directly on the high-k dielectric layer 106 and a first portion 124a of a second metal gate layer 124 disposed over the first metal gate layer 122. The first metal gate layer 122 can be absent from a second gate structure 108b within the second device region 104b, so that the second gate structure 108b comprises a second portion 124b of the second metal gate layer 124, which has a bottom surface lower than a bottom surface of the first portion 124a. In some embodiments, the first metal gate layer 122 may comprise a first work function metal layer while the second metal gate layer 124 may comprise a plurality of conductive layers such as a barrier layer, a cap layer or a second work function metal layer. The first metal gate layer 122 functions as a work function metal layer and helps to tune the work functions of the gate structures 108a-108b within the first device region 104a.

In some embodiments, the first portion 124a of the second metal gate layer 124 is disposed directly on the first metal gate layer 122. The second portion 124b is disposed directly on the high-k dielectric layer 106. In some embodiments, a bottom surface of the second portion 124b of the second metal gate layer 124 can be aligned with that of the first metal gate layer 122. In some embodiments, the second portion 124b of the second metal gate layer 124 and the first metal gate layer 122 may have upper surfaces that are also aligned. In some embodiments, sidewall spacers 126 can be disposed at peripheries of the gate structures 108a-108b.

By forming the first metal gate layer 122 directly onto the high-k dielectric layer 106, the patterning window of the first metal gate layer 122 (e.g., a work function metal layer arranged directly onto the dielectric layer 106) is improved.

Figure 1B:
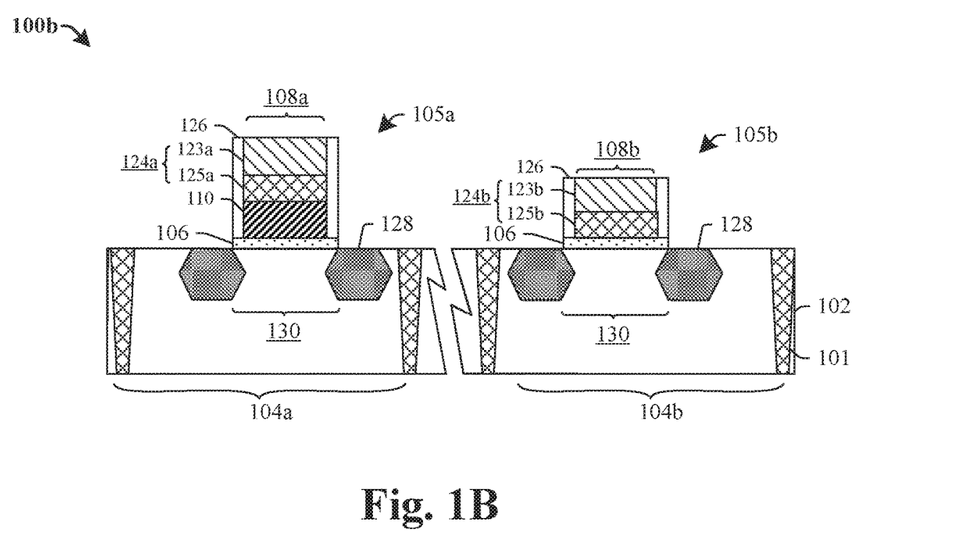
FIG. 1B illustrates a cross-sectional view of some additional embodiments of an integrated circuit with a work function metal layer disposed directly on a high-k dielectric layer.

FIG. 1b illustrates a cross-sectional view of some alternative embodiments of an integrated circuit 100b with a work function metal layer disposed directly on a high-k dielectric layer.

The integrated circuit 100b comprises a first device region 104a having a transistor 105a with a first gate structure 108a and a second device region 104b having a transistor 105b with a second gate structure 108b. The first gate structure 108a has a first work function metal layer 110 arranged directly onto a high-k dielectric layer 106 and a metal layer 124 comprising a cap layer 125 and a second work functional metal layer 123. The first work function metal layer 110 is vertically separated from a first portion 123a of a second work function metal layer 123 by a first portion 125a of the cap layer 125. The second gate structure 108b has a second portion 125b of the capping layer 125 arranged directly onto the high-k dielectric layer 106. A second portion 123b of the second work function metal layer 123 is separated from the high high-k dielectric layer 106 by the second portion 125b of the cap layer 125.

In some embodiments, the first device region 104a comprises a first transistor 105a of a first conductivity type, and the second device region 104b comprises a second transistor 105b of a second conductivity type that is different from the first type. For example, the first transistor 105a can be a p-type transistor and the second transistor 105b can be an n-type transistor. Correspondingly, the source/drain regions 128 of the first transistor 105a are p-doped and the source/drain regions 128 of the second transistor 105b are n-doped. In some other embodiments, the first transistor 105a and the second transistor 105b may have different designed threshold values. For example, the first transistor 105a can have a designed threshold value smaller than the second transistor 105b. The first transistor 105a is operated at a low or ultra-low threshold value. The first gate structure 108a can have a work function greater than that of the second gate structure 108b. For example, the first gate structure 108a can have a work function of about 4.67 eV on the high-k dielectric layer 106 and the second gate structure 108b can have a work function of about 4.59 eV on the high-k dielectric layer 106.

The first metal gate layer 122 can be a single work function metal layer with a thickness in a range of about 5 Å to about 15 Å and the second metal gate layers 124 can comprise a plurality of conductive layers with a total thickness in a range of about 30 Å to about 100 Å. In some embodiments, the first metal gate layer 122 comprises titanium nitride (TiN). The second metal gate layer 124 can comprise titanium nitride (TiN) or tantalum nitride (TaN). The high-k dielectric layer 106 has a dielectric constant greater than that of the silicon dioxide (around 3.9). In some embodiments, the high-k dielectric layer 106 may comprise composite having element hafnium, such as hafnium oxide ($HfO_x$), hafnium silicon oxynitride (HfSiON) and so on. The high-k dielectric layer 106 can also comprise other suitable materials such as zirconium oxide ($ZrO_x$), aluminum oxide ($AlO_x$), nickel oxide ($NiO_x$), tantalum oxide ($TaO_x$), or titanium oxide ($TiO_x$).

Figure 1C:
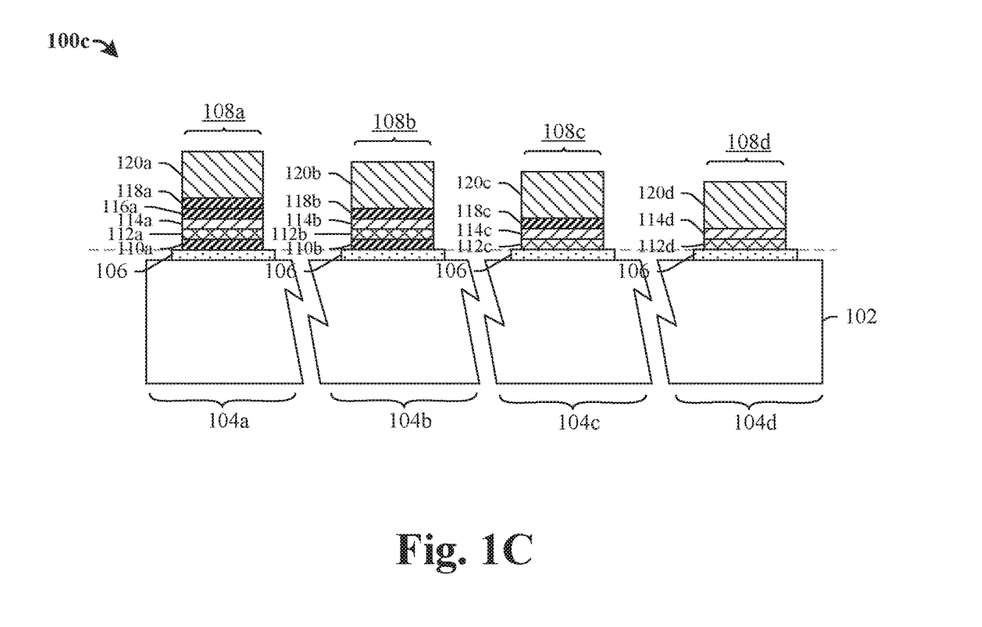
FIG. 1C illustrates a cross-sectional view of some additional embodiments of an integrated circuit with a work function metal layer disposed directly on a high-k dielectric layer.

FIG. 1c illustrates a cross-sectional view of some embodiments of an integrated circuit 100c with a work function metal layer disposed directly on a high-k dielectric layer.

As shown in FIG. 1c, the integrated circuit 100b comprises a substrate 102 having a first device region 104a, a second device region 104b, a third device region 104c and a fourth device region 104d. The device regions 104a-104d could comprise transistors of different types or operated at different threshold values. For example, the first device region 104a could comprise a p-type transistor with a relative low designed threshold value while the second device region 104b could comprise a p-type transistor with a standard designed threshold value (e.g., a threshold value greater than that of the p-type transistor in the first device region 104a). The third device region 104c could comprise an n-type transistor with a standard designed threshold value while the fourth device region 104d could comprise an n-type transistor with a relative low threshold value.

In some embodiments, some of the device regions, for example the first device region 104a and the fourth device region 104d, or the second device region 104b and the third device region 104c, are disposed next to one another and separated by isolation regions. In other embodiments, the device regions 104a-104d are spaced apart from another. In some embodiments, the substrate 102 can be a lightly doped bulk semiconductor substrate. The substrate 102 can also be a binary semiconductor substrate (e.g. GaAs), a tertiary semiconductor substrate (e.g. AlGaAs), or a higher order semiconductor substrate, for example. Further, the substrate 102 can also include non-semiconductor materials such as oxide in silicon-on-insulator (SOI), partial SOI substrate, polysilicon, amorphous silicon, organic materials, and/or any other type of semiconductor/non-semiconductor and/or deposited or grown (e.g. epitaxial) layers formed on an underlying substrate. Though not shown in FIG. 1c, the substrate 102 can include doped source/drain regions formed through ion implantation, or by forming recesses in the substrate 102 and filling the recesses with a strain-inducing source/drain material (e.g., epitaxially-grown SiP or SiGe).

In some embodiments, a first work function metal layer 110 is disposed directly on the high-k dielectric layer 106, comprising a first portion 110a within the first device region 104a and a second portion 110b within the second device region 104b. The first work function metal layer 110 can be absent of the third gate structure 108c and the fourth gate structure 108d. A cap layer 112, including portions 112a, 112b, 112c and 112d corresponding to gate structures 108a, 108b, 108c and 108d, can be disposed over the first work function metal layer 110 for the first gate structure 108a and second gate structure 108b, and disposed over the high-k dielectric layer 106 for the third gate structure 108c and the fourth gate structure 108d. Portions 112c and 112d can be disposed directly on the high-k dielectric layer 106 and thus have bottom surfaces aligned with that of the first work function metal layer 110. In some embodiments, a barrier layer 114, including portions 114a, 114b, 114c and 114d corresponding to gate structures 108a, 108b, 108c and 108d, can be disposed over the cap layer 112. The barrier layer 114 can comprise tantalum nitride (TaN).

In some embodiments, the first gate structure 108a further comprises a second work function metal layer 116 (a first portion 116a) disposed over the barrier layer 114 and a third work function metal layer 118 (a first portion 118a) and a fourth work function metal layer 120 (a first portion 120a) disposed in that order. The second gate structure 108b further comprises a second portion 118b of the third work function metal layer 118 and a second portion 120b of the fourth work function metal layer 120 disposed over a second portion 114b of the barrier layer 114. The third gate structure 108c further comprises a third portion 118c of the third work function metal layer 118 and a third portion 120c of the fourth work function metal layer 120 disposed over a third portion 114c the barrier layer 114. The fourth gate structure 108d further comprises a fourth portion 120d of the fourth work function metal layer 120 disposed over a fourth portion 114d the barrier layer 114.

Portions of these work function metal layers sequentially "step down" as some of previous work function metal layers are absent from some of the gate structures 108a-108d. Notably, FIG. 1c shows an example of how work function metal layers 110, 116, 118 and 120 are arranged in gate structures 108a-108d for illustration purposes, however, it is appreciated by person with ordinary skill in the art that the amount, materials, patterns and thicknesses of varies work function metal layers can be adjusted to fulfill work functions' requirements of the gate structures 108a-108d for different applications. Such adjustments are amenable.

FIGS. 2-9 illustrate some embodiments of cross-sectional views showing a method of forming an integrated circuit with a work function metal layer directly patterned on a high-k dielectric layer.

Figure 2:
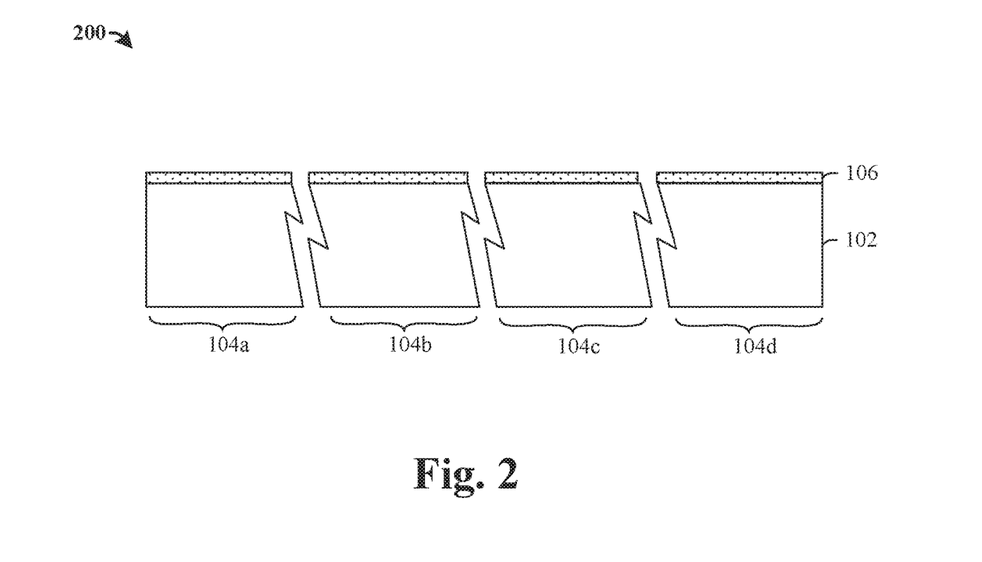
FIGS. 2-9 illustrate some embodiments of cross-sectional views showing a method of forming an integrated circuit with a work function metal layer directly patterned on a high-k dielectric layer.

As shown in a cross-sectional view 200 of FIG. 2, a high-k dielectric layer 106 is formed over a substrate 102. In some embodiments, the high-k dielectric layer 106 has a dielectric constant greater than that of the silicon dioxide (around 3.9). The high-k dielectric layer 106 may comprise a composite having the element hafnium, such as hafnium oxide (HfOx), hafnium silicon oxynitride (HfSiON) and so on. The high-k dielectric layer 106 can also comprise other suitable materials such as zirconium oxide ($ZrO_x$), aluminum oxide ($AlO_x$), nickel oxide ($NiO_x$), tantalum oxide ($TaO_x$), or titanium oxide ($TiO_x$). The high-k dielectric layer 106 may be formed using a vapor deposition technique (e.g., physical vapor deposition, chemical vapor deposition, etc.). In some embodiments, the high-k dielectric layer 106 may be formed to have a thickness in a range of from about 10 Å to about 20 Å. In some embodiments, the substrate 102 can be a lightly doped bulk semiconductor substrate. The substrate 102 can also include non-semiconductor materials such as oxide in silicon-on-insulator (SOI), partial SOI substrate, polysilicon, amorphous silicon, organic materials, and/or any other type of semiconductor/non-semiconductor and/or deposited or grown (e.g. epitaxial) layers formed on an underlying substrate. Though not shown in FIG. 2, the substrate 102 can include doped source/drain regions formed through ion implantation, or formed by forming recesses in the substrate 102 and filling the recesses with a strain-inducing source/drain material (e.g., epitaxially-grown SiP or SiGe). In some embodiments, an interfacial layer could be formed between the high-k dielectric layer 106 and the substrate 102.

The substrate 102 comprises a plurality of different device regions 104a-104d. In some embodiments, the plurality of different device regions may comprise a first device region 104a, a second device region 104b, a third device region 104c, and a fourth device region 104d. The plurality of different device regions 104a-104b may respectively comprise different types of transistor devices having different designed threshold values. For example, the first device region 104a may comprise low threshold p-type transistors, the second device region 104b may comprise standard p-type transistors, the third device region 104c may comprise standard n-type transistors, and the fourth device region 104d may comprise low threshold n-type transistors. The low threshold p-type transistors and the lower threshold n-type transistors have threshold values smaller than those of the standard p-type transistors and the standard n-type transistors.

Figure 3:
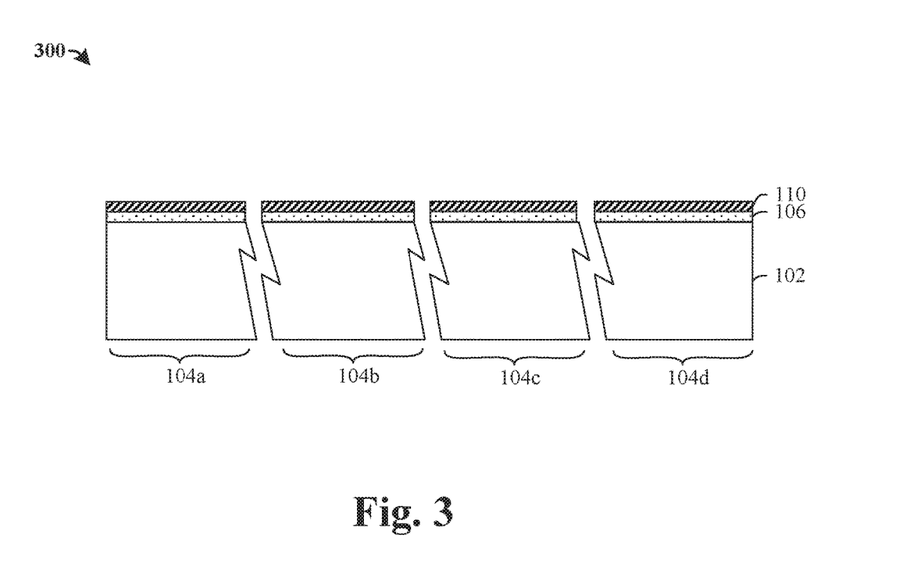

As shown in a cross-sectional view 300 of FIG. 3, a first work function metal (WFM) layer 110 is formed directly on the high-k dielectric layer 106. In some embodiments, the first work function metal layer 110 may comprise a metal nitride, such as titanium nitride. The first work function metal layer 110 may be formed using a vapor deposition technique (e.g., physical vapor deposition, chemical vapor deposition, etc.). In some embodiments, the first work function metal layer 110 may be formed to have a thickness in a range of from about 5 Å to about 15 Å.

Figure 4:
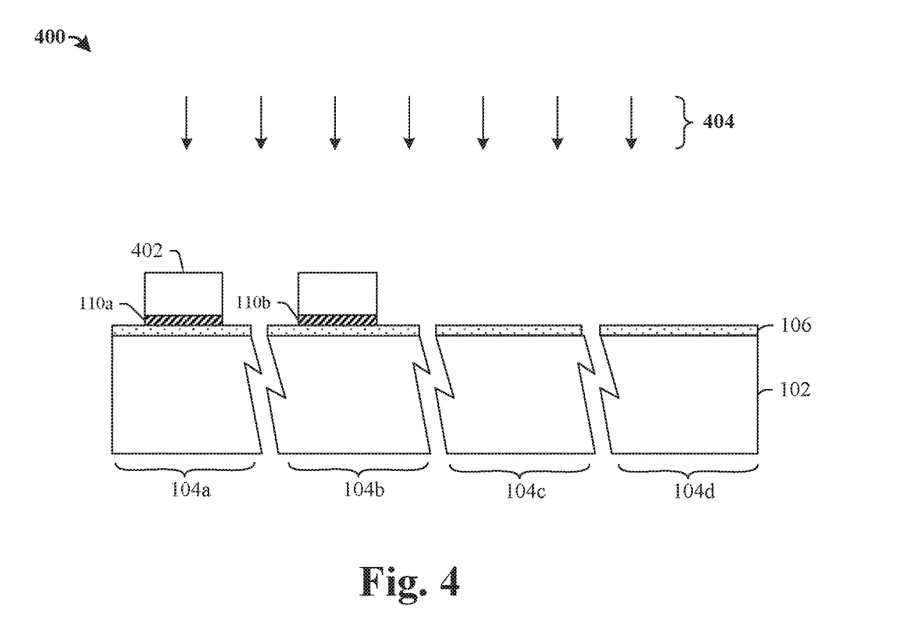

As shown in a cross-sectional view 400 of FIG. 4, the first work function metal layer 110 is patterned according to a first patterning process. A first mask layer 402 can be formed to cover first and second gate regions of a first device region 104a and a second device region 104b, and to expose third and fourth gate regions of a third device region 104c and a fourth device region 104d. The first work function metal layer 110 is selectively etched to expose a selective region of the high-k dielectric layer 106 according to the first mask layer 402. The first work function metal layer 110 can be etched using a dry etch or a wet etch. In some embodiments, the first work function metal layer 110 can be etched using a first etchant 404 comprising SC2 or SC1 based solution. In some embodiments, the first etchant 404 has an etch rate ratio of the first work function metal layer 110 to the high-k dielectric layer 106 greater than about 1400 (i.e., the first etchant 404 etches the first work function metal layer 110 more than 1400 times faster than the high-k dielectric layer 106). After the first patterning process, the first work function metal layer 110 comprises a first portion 110a within the first device region 104a and a second portion 110b within the second device region 104b.

Figure 5:
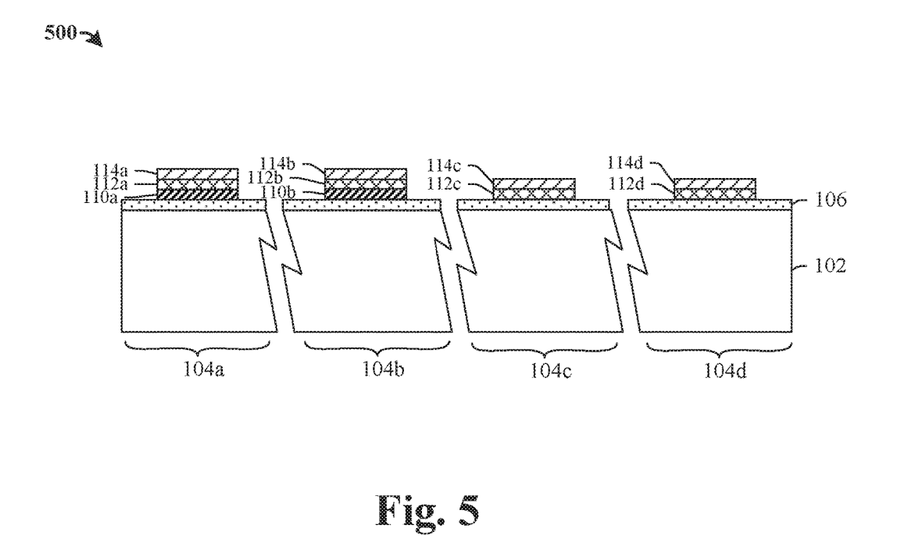

As shown in a cross-sectional view 500 of FIG. 5, a cap layer 112 and a barrier layer 114 can be formed over the first work function metal layer 110 and the high-k dielectric layer 106. In some embodiments, the cap layer 112 can be formed to include discrete portions 112a and 112b corresponding to the first and second gate regions on the first work function metal layer 110 and discrete portions 112c and 112d corresponding to the third and fourth gate regions directly on the high-k dielectric layer 106. The portions 112c and 112d have bottom surfaces aligned with a bottom surface of the first work function metal layer 110 in the first device region 104a and the second device region 104b.

In some embodiments, a barrier layer 114 can be disposed over the cap layer 112. The barrier layer 114 may include portions 114a-114d respectively corresponding to device regions 104a-104d. The barrier layer 114 can comprise tantalum nitride (TaN). The cap layer 112 and the barrier layer 114 may be formed using a vapor deposition technique (e.g., physical vapor deposition, chemical vapor deposition, etc.). In some embodiments, the cap layer 112 and the barrier layer 114 are formed after a replacement gate process, i.e. the cap layer 112 and the barrier layer 114 can be formed between sidewall spacers after a gate oxide and a polysilicon gate are removed.

Figure 6:
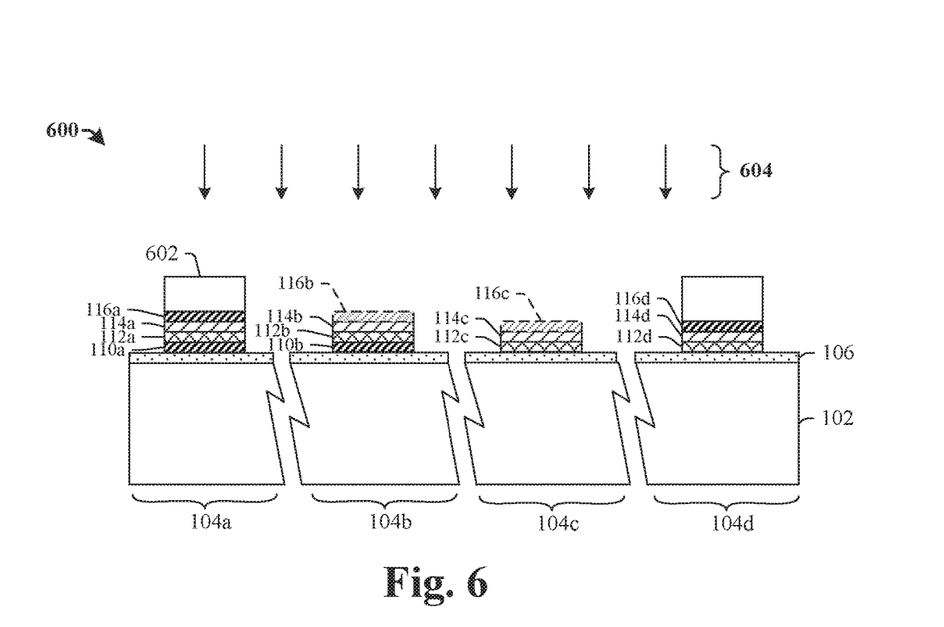

As shown in a cross-sectional view 600 of FIG. 6, a second work function metal layer 116 is formed, and subsequently patterned over the barrier layer 114 according to a second patterning process. The second work function metal layer 116 may be formed using a same material with the first work function metal layer 110 and using a vapor deposition technique (e.g., physical vapor deposition, chemical vapor deposition, etc.). In some embodiments, the second work function metal layer 116 may be formed to have a thickness in a range of from about 5 Å to about 15 Å.

A second mask layer 602 can be formed to cover the first and fourth gate regions of the first device region 104a and the fourth device region 104d, and to expose the second and third gate regions of the second device region 104b and the third device region 104c. The second work function metal layer 116 is selectively etched according to the second mask layer 602. The second work function metal layer 116 can be etched using a dry etch or a wet etch by a second etchant 604. After the second patterning process, a first portion 116a and a fourth portion 116d of the second work function metal layer 116 are kept while a second portion 116b and a third portion 116c are removed by the second etchant 604.

Figure 7:
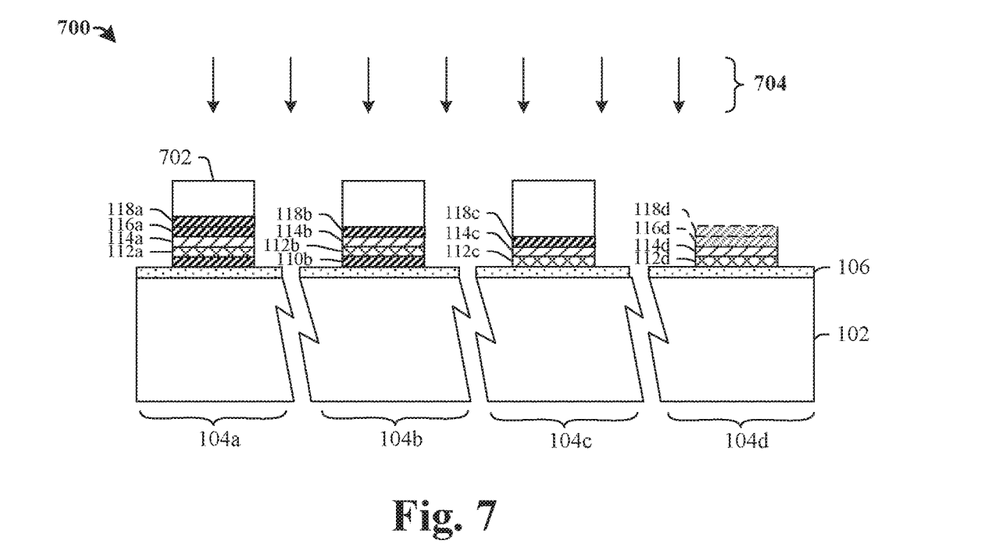

As shown in a cross-sectional view 700 of FIG. 7, a third work function metal layer 118 is formed, and subsequently patterned over the second work function metal layer 116 according to a third patterning process. A third mask layer 702 can be formed to cover the first, second and third gate regions of the first device region 104a, second device region 104b and the third device region 104c, and to expose the fourth gate region of the fourth device region 104d. The third work function metal layer 118 is selectively etched according to the third mask layer 702. The third work function metal layer 118 can be etched using a dry etch or a wet etch by a third etchant 704. After the third patterning process, a first portion 118a, a second portion 118b and a third portion 116c of the third work function metal layer 118 are kept while a fourth portion 118d is removed by the third etchant 704.

Figure 8:
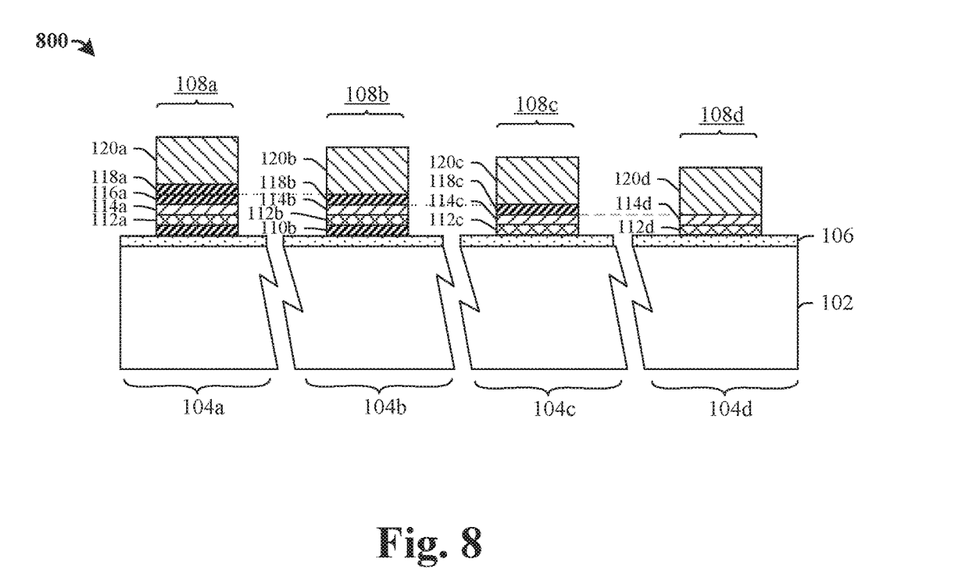

As shown in a cross-sectional view 800 of FIG. 8, a fourth work function metal layer 120 is formed over the second work function metal layer 116 and the third work function metal layer 118. In some embodiments, the fourth work function metal layer 120 can be formed to include a first portion 120a arranged within the first gate region 104a and having a bottom surface furthest from an upper surface of the substrate 102 among all portions of the fourth work function metal layer 120. A second portion 120b arranged within the second gate region 104b "steps down" from the first portion 120a and may have a bottom surface aligned with that of the first portion 118a of the third work function metal layer 118. A third portion 120c arranged within the third gate region 104c further "steps down" from the second portion 120b and may have a bottom surface aligned with that of the second portion 118b of the third work function metal layer 118. A fourth portion 120d arranged within the fourth gate region 104d further "steps down" from the third portion 120c and may have a bottom surface aligned with that of the third portion 114c of the barrier layer 114.

In some embodiments, the fourth work function metal layer 120 may comprise a plurality of metal layers stacked together. The fourth work function metal layer 120 may be formed using a vapor deposition technique (e.g., physical vapor deposition including sputter deposition, chemical vapor deposition, etc.). In some embodiments, the fourth work function metal layer 120 may be formed to have a thickness in a range of from about 10 Å to about 50 Å.

FIGS. 4-8 show an example of how work function metal layers 110, 116, 118 and 120 are formed and patterned in the gate regions to form gate structures 108a-108d for illustration purposes. However, it is appreciated that the amount, materials, patterns and thicknesses of varies work function metal layers can be adjusted to fulfill work functions' requirements of the gate regions for different applications.

Figure 9:
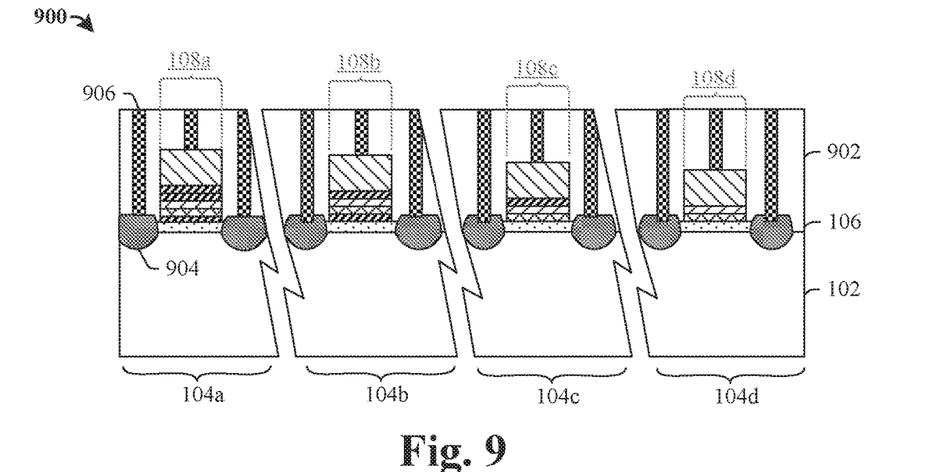

As shown in a cross-sectional view 900 of FIG. 9, source/drain regions 904 may be formed on opposing sides of the gate structures 108a-108d. In some embodiments, the source/drain regions 904 may be formed by implanting a dopant species into the substrate 102. In some alternative embodiments, the source/drain regions 904 may be formed by etching a recess in the substrate 102 and subsequently performing an epitaxial growth process to form source/drain regions 904 within the recesses.

An ILD layer 902 is subsequently formed over the substrate 102 at locations surrounding the gate structures 108a-108d. Conductive contacts 906 are formed through the ILD layer 902. The conductive contacts 906 are electrically coupled to the gate structures 108a-108d and to the source/drain regions 904. In some embodiments, the ILD layer 902 may comprise one or more layers of an oxide, a low-k dielectric, or an ultra low-k dielectric. The conductive contacts 906 may comprise copper, tungsten, and/or aluminum. In some embodiments, the conductive contacts may be formed by selectively etching the ILD layer 902 to form contact holes. A metal (e.g., copper, aluminum, etc.) is then deposited to fill the contact holes, and a planarization process is performed to be removed excess metal.

It will be appreciated that in some embodiments, though not shown in figures, the source/drain regions 904 can be formed even before forming the first work function metal layer 110. For example, in some embodiments, polysilicon gates are firstly formed within the first, second, third and fourth gate regions. Then sidewall spacers are formed alongside the polysilicon gates. Then the p-type source/drain regions can be formed alongside the first and second gate regions and n-type source/drain regions can be formed alongside the third and fourth gate regions through ion implantation, or by forming recesses in the substrate 102 and filling the recesses with a strain-inducing source/drain material (e.g., epitaxially-grown SiP or SiGe). The polysilicon gates protect underlying channel regions from being contaminated during the formation of the source/drain regions. The polysilicon gates are subsequently removed and the metal gates including work function metal layers are formed in places of the polysilicon gates.

Figure 10:
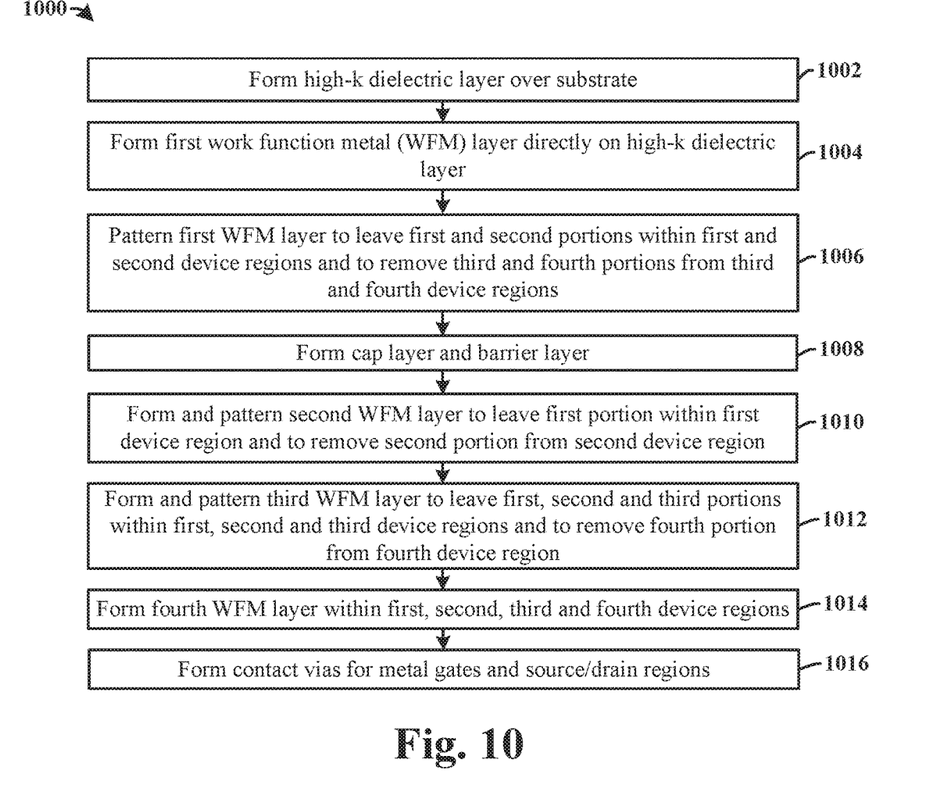
FIG. 10 illustrates a flow diagram of some embodiments of a method of forming an integrated circuit with a work function metal layer directly patterned on a high-k dielectric layer.

FIG. 10 illustrates a flow diagram of some embodiments of a method 1000 of forming an integrated circuit with a work function metal layer directly patterned on a high-k dielectric layer.

While the disclosed method 1000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1002, a high-k dielectric layer is formed over a substrate. The high-k dielectric layer may comprise gate dielectrics for transistors. The substrate has first, second, third and fourth device regions having transistors of different types or with different designed threshold values.

At 1004, a first work function metal layer is formed directly on the high-k dielectric layer.

At 1006, the first work function metal layer is patterned to leave first and second portions within the first and second device regions and to remove third and fourth portions from the third and fourth device regions.

At 1008, a cap layer and a barrier layer are formed over the patterned first work function metal and the high-k dielectric layer.

At 1010, a second work function metal layer is formed and patterned to leave a first portion within the first device region and to remove a second portion from the second device region.

At 1012, a third work function metal layer is formed and patterned to leave first, second, and third portions within the first, second, and third device regions and to remove a fourth portion from the fourth device region.

At 1014, a fourth work function metal layer is formed at the first, second, third and fourth device regions.

At 1016, conductive contacts are formed for metal gates and source/drain regions.

Therefore, the present disclosure relates to an integrated circuit comprising an integrated circuit with a work function metal layer disposed directly on a high-k dielectric layer, and an associated method of formation.

In some embodiments, the present disclosure relates to a method of forming an integrated circuit. The method comprises forming a high-k dielectric layer over a substrate. The substrate comprises a first device region and a second device region. The method further comprises forming a first work function metal layer directly on the high-k dielectric layer. The method further comprises patterning the first work function metal layer to be left the first work function metal layer at a first gate region of the first device region, and to expose the high-k dielectric layer at a second gate region of the second device region.

In other embodiments, the present disclosure relates to a method of forming an integrated circuit. The method comprises forming a high-k dielectric layer over a substrate. The substrate comprising a first device region, a second device region, a third device region and a fourth device region having transistors of different types or with different threshold values. The method further comprises forming a first work function metal layer directly on the high-k dielectric layer and patterning the first work function metal layer to be left a first portion at a first gate region of the first device region and a second portion at a second gate region of the second device region, and to expose the high-k dielectric layer at a third gate region of the third device region and a fourth gate region of the fourth device region. The method further comprises forming a second work function metal layer over the patterned first work function metal layer and exposed high-k dielectric layer and patterning the second work function metal layer to be left a first portion at the first gate region and to be removed a second portion at the second gate region.

In yet other embodiments, the present disclosure relates to an integrated circuit. The integrated circuit comprises a substrate comprising a first device region and a second device region. The integrated circuit further comprises a high-k dielectric layer disposed over the substrate and a first work function metal layer disposed directly on the high-k dielectric layer at a first gate region of the first device region. The integrated circuit further comprises a second work function metal layer having a first portion over the first work function metal layer at the first gate region and a second portion over a second gate region of the second device region. The second portion of the second work function metal layer has a bottom surface lower than a bottom surface of the first portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, comprising:
   forming a high-k dielectric layer over a substrate comprising a first device region, a second device region, and a third device region;
   forming a first work function metal layer directly on the high-k dielectric layer; and
   patterning the first work function metal layer to leave the first work function metal layer within a first gate region of the first device region and a second gate region of the second device region, and to remove the first work function metal layer and expose the high-k dielectric layer within a third gate region of the third device region;
   forming a second work function metal layer within the first gate region, the second gate region and the third gate region; and
   patterning the second work function metal layer to leave a first portion within the first gate region and to remove a second portion within the second gate region and a third portion within the third gate region.

2. The method of claim 1, further comprising:
   forming source/drain regions alongside the first gate region of the first device region; and
   forming source/drain regions alongside the second gate region of the second device region.

3. The method of claim 1, wherein the first work function metal layer comprises titanium nitride (TiN).

4. The method of claim 1, wherein the first work function metal layer is patterned by applying a wet etchant solution having an etch rate ratio of the first work function metal layer to the high-k dielectric layer greater than about 1400.

5. The method of claim 1, further comprising:
after patterning the first work function metal layer and prior to forming the second work function metal layer, forming a barrier layer over the first work function metal layer and the high-k dielectric layer within the first gate region, the second gate region and the third gate region.

6. The method of claim 1, wherein the second portion of the second work function metal layer is formed to have a bottom surface aligned with a bottom surface of the first work function metal layer.

7. A method of forming an integrated circuit, comprising:
forming a high-k dielectric layer over a substrate comprising a first device region, a second device region, a third device region and a fourth device region;
forming a first work function metal layer directly on the high-k dielectric layer;
patterning the first work function metal layer to leave a first portion within a first gate region of the first device region and a second portion within a second gate region of the second device region, and to expose the high-k dielectric layer within a third gate region of the third device region and within a fourth gate region of the fourth device region;
forming a second work function metal layer over the patterned first work function metal layer and exposed high-k dielectric layer; and
patterning the second work function metal layer to leave a first portion within the first gate region and to remove a second portion within the second gate region.

8. The method of claim 7, further comprising:
forming a cap layer between the first work function metal layer and the second work function metal layer;
wherein the cap layer is formed to cover the first, second, third and fourth gate regions.

9. The method of claim 8, further comprising:
forming a barrier layer between the cap layer and the second work function metal layer;
wherein the cap layer is formed to cover the first, second, third and fourth gate regions.

10. The method of claim 9, wherein the first work function metal layer and the second work function metal layer comprise titanium nitride (TiN) and the barrier layer comprises tantalum nitride (TaN).

11. The method of claim 7, further comprising:
forming and patterning a third work function metal layer to leave first, second and third portions within the first, second and third gate regions and to remove a fourth portion within the fourth gate region; and
forming and patterning a fourth work function metal layer within the first, second, third and fourth gate regions.

12. The method of claim 7, before forming the first work function metal layer:
forming polysilicon gates within the first, second, third and fourth gate regions;
forming sidewall spacers alongside the polysilicon gates;

forming p-type source/drain regions alongside the first and second gate regions and n-type source/drain regions alongside the third and fourth gate regions; and
removing the polysilicon gates.

13. The method of claim 7, wherein the first device region comprises low threshold p-type transistors, the second device region comprises standard p-type transistors, the third device region comprises standard n-type transistors, and the fourth device region comprises low threshold n-type transistors;
wherein the low threshold p-type transistors and the low threshold n-type transistors have threshold values smaller than those of the standard p-type transistors and the standard n-type transistors.

14. The method of claim 7, wherein the first work function metal and the second work function metal are a same material.

15. The method of claim 7, wherein the first work function metal layer is patterned by applying a wet etchant having an etch rate ratio of the first work function metal layer to the high-k dielectric layer that is greater than about 1400.

16. A method of forming an integrated circuit, comprising:
forming a substrate comprising a first device region, a second device region, and a third device region;
depositing a high-k dielectric layer over the substrate;
forming a first work function metal layer directly on the high-k dielectric layer;
patterning the first work function metal layer to leave a first portion within the first device region and a second portion within the second device region, and to expose the high-k dielectric layer within the third device region;
forming a cap layer over the first work function metal layer within the first device region and the second device region and over the high-k dielectric layer within the third device region;
forming a second work function metal layer over the cap layer; and
patterning the second work function metal layer to leave a first portion within the first device region and to remove a second portion within the second device region.

17. The method of claim 16, wherein the first device region is formed to have p-type transistors and the second device region is formed to have n-type transistors.

18. The method of claim 16, wherein the first work function metal layer and the second work function metal layer are formed using titanium nitride (TiN).

19. The method of claim 16, wherein the second work function metal layer is patterned to remove a third portion within the third device region.

20. The method of claim 16, further comprising:
forming sidewall spacers at peripheries of the first work function metal layer and the second work function metal layer; and
forming p-type source/drain regions alongside the first work function metal layer and n-type source/drain regions alongside the second work function metal layer.

* * * * *